(12) United States Patent
Sato et al.

(10) Patent No.: US 7,969,000 B2
(45) Date of Patent: *Jun. 28, 2011

(54) SEMICONDUCTOR DEVICE

(75) Inventors: Yukihiro Sato, Tokyo (JP); Norio Kido, Tokyo (JP); Tatsuhiro Seki, Tokyo (JP); Katsuo Ishizaka, Tokyo (JP); Ichio Shimizu, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/706,295

(22) Filed: Feb. 16, 2010

(65) Prior Publication Data

US 2010/0140718 A1    Jun. 10, 2010

Related U.S. Application Data

(62) Division of application No. 11/476,868, filed on Jun. 29, 2006, now Pat. No. 7,692,285.

(30) Foreign Application Priority Data

Jun. 30, 2005    (JP) ................................. 2005-191449

(51) Int. Cl.
   *H01L 27/092*    (2006.01)
(52) U.S. Cl. ... 257/723; 257/690; 257/696; 257/E23.01; 257/E23.012; 257/E23.042; 257/E23.052
(58) Field of Classification Search ................. 257/723, 257/E23.01, E23.012, E23.042, E23.052, 257/690, 696
See application file for complete search history.

(56) References Cited

U.S. PATENT DOCUMENTS

| | | | |
|---|---|---|---|
| 6,501,156 B1 * | 12/2002 | Nakanishi et al. | ............ 257/666 |
| 6,867,494 B2 | 3/2005 | Kameda et al. | |
| 6,882,047 B2 | 4/2005 | Hata et al. | |
| 2003/0107120 A1 | 6/2003 | Connah et al. | |
| 2004/0095729 A1 | 5/2004 | Vaysse et al. | |
| 2004/0142505 A1 | 7/2004 | Huang et al. | |
| 2005/0121777 A1 * | 6/2005 | Hata et al. | ...................... 257/713 |
| 2005/0218489 A1 | 10/2005 | Satou et al. | |
| 2005/0237033 A1 | 10/2005 | Shirakawa et al. | |
| 2005/0258521 A1 | 11/2005 | Park et al. | |

FOREIGN PATENT DOCUMENTS

| | | |
|---|---|---|
| JP | 2002-110882 | 4/2002 |
| JP | 2003-124436 | 4/2003 |
| JP | 2003-197862 | 7/2003 |
| JP | 2003-332518 | 11/2003 |
| JP | 2004-273749 | 9/2004 |
| WO | 02/099878 A1 | 12/2002 |

* cited by examiner

*Primary Examiner* — Eugene Lee
*Assistant Examiner* — Peniel M Gumedzoe
(74) *Attorney, Agent, or Firm* — Mattingly & Malur, PC

(57) ABSTRACT

A semiconductor device having a plurality of chips is reduced in size. In HSOP (semiconductor device) for driving a three-phase motor, a first semiconductor chip including a pMISFET and a second semiconductor chip including an nMISFET are mounted over each of a first tab, second tab, and third tab. The drains of the pMISFET and nMISFET over each tab are electrically connected with each other. Thus, two of six MISFETs can be placed over each of three tabs divided in correspondence with the number of phases of the motor, and they can be packaged in one in a compact manner. As a result, the size of the HSOP for driving a three-phase motor, having a plurality of chips can be reduced.

3 Claims, 16 Drawing Sheets

SEMICONDUCTOR DEVICE

CROSS-REFERENCE TO RELATED APPLICATION

This is a divisional application of U.S. Ser. No. 11/476,868, filed Jun. 29, 2006 (now U.S. Pat. No. 7,692,285), which claims priority from Japanese patent application No. 2005-191449 filed on Jun. 30, 2005, the disclosures of all of the above-identified applications are hereby incorporated by reference into this application.

BACKGROUND OF THE INVENTION

The present invention relates to a semiconductor device and in particular to a technique effectively applicable to a semiconductor device having power MISFETs (Metal Insulator Semiconductor Field Effect Transistors).

For example, Patent Documents 1 and 2 disclose semiconductor devices for driving a three-phase motor.

For example, Patent Documents 3 and 4 disclose semiconductor devices for DC-DC converter.

For example, Patent Document 5 discloses a processing method for HSOP.

[Patent Document 1] Japanese Unexamined Patent Publication No. 2004-273749 (FIG. 1)
[Patent Document 2] Japanese Unexamined Patent Publication No. 2003-197862 (FIG. 3)
[Patent Document 3] Japanese Unexamined Patent Publication No. 2003-124436 (FIG. 5)
[Patent Document 4] Japanese Unexamined Patent Publication No. 2003-332518 (FIG. 17)
[Patent Document 5] Japanese Unexamined Patent Publication No. 2002-110882 (FIG. 1)

For example, when a circuit for driving a vehicle-mounted motor or any other like motor is constructed, a plurality of MOSFETs (Metal Oxide Semiconductor Field Effect Transistors) are used for this purpose. The plurality of MOSFETs are independently formed in a plurality of packages. The circuit for driving a motor is constructed by mounting these plurality of packages over a mounting board.

In this case, a problem arises because a plurality of semiconductor devices are mounted. A footprint is increased, and downsizing is infeasible.

Consequently, the present inventors considered multi (plural) chip packages (semiconductor devices) of high heat radiation type which allow footprints to be reduced.

A DC-DC converter having two MOSFETs (semiconductor chips) will be taken as an example. In cases where the DC-DC converter has two semiconductor chips mounted over a tab and two MOSFETs are nMOSFET and pMOSFET, a drain can be shared between them. Therefore, the tab need not be divided, and the DC-DC converter is of such construction that two semiconductor chips are mounted over one tab.

In cases where two MOSFETs are both nMOSFET in a DC-DC converter, a drain cannot be shared between them. Therefore, it is required to divide a tab into one for the high-side semiconductor chip of one nMOSFET and one for the low-side semiconductor chip of the other nMOSFET. Thus, the DC-DC converter is of such construction that a semiconductor chip containing an nMOSFET is mounted over each of the two divided tabs. (Refer to Patent Document 3)

That is, in a DC-DC converter having two MOSFETs (semiconductor chips), a tab is so constructed that it is not divided as in the former of the above examples or so constructed that it is divided into two as in the latter.

In the technology disclosed in Patent Document 1 (Japanese Unexamined Patent Publication No. 2004-273749), a wire is connected to a frame. Therefore, the following problem arises: it is required to ensure areas for wire connection in frames, and this imposes limitation on chip size.

In addition, the following problem can also arise: since wires are bonded astride frames, the switching noise of a low-side transistor element adversely affects a high-side transistor element via the inductance of a wire. As a result, the high-side transistor element can be caused to malfunction.

SUMMARY OF THE INVENTION

An advantage of the invention is to provide a technique that enables downsizing of a semiconductor device having a plurality of chips.

Another advantage of the invention is to provide a technique that enables the enhancement of the heat radiating property of a semiconductor device having a plurality of chips.

The above and further advantages and novel features of the invention will be apparent from the description of this specification and the accompanying drawings.

The following is a brief description of the gist of the representative elements of the invention laid open in this application.

The invention includes: a semiconductor chip including a pMISFET and a semiconductor chip including an nMISFET respectively mounted over first, second, and third tabs; a plurality of leads electrically connected with the individual semiconductor chips; and a sealing portion that seals the first, second, and third tabs and the semiconductor chips. The drains of the pMISFET and nMISFET mounted over each of the first, second, and third tabs are electrically connected with each other.

Also, the invention includes: a semiconductor chip including a pMISFET and a semiconductor chip including an nMISFET respectively mounted over first and second tabs; a plurality of leads electrically connected with the individual semiconductor chips; and a sealing portion that seals the first and second tabs and the semiconductor chips. The drains of the pMISFET and nMISFET mounted over each of the first and second tabs are electrically connected with each other.

Further, the invention includes: first, second, third, and fourth tabs; semiconductor chips including a pMISFET respectively mounted over first and second tabs; semiconductor chips including an nMISFET respectively mounted over third and fourth tabs; a plurality of leads electrically connected with each semiconductor chip; and a sealing portion that seals the first, second, third, and fourth tabs and the semiconductor chips.

The following is a brief description of the gist of the effects obtained by the representative elements of the invention laid open in this application.

In a semiconductor device for driving a three-phase motor, a semiconductor chip including a pMISFET and a semiconductor chip including an nMISFET are mounted over each of first, second, and third tabs. The drains of the pMISFET and nMISFET over each tab are electrically connected with each other. This makes it possible to place two of six MISFETs over each of three tabs divided in accordance with the number of phases of the motor and package them in one in a compact manner. As a result, the semiconductor device for driving a three-phase motor, having a plurality of chips can be reduced in size. The backsides of the first, second, and third tabs are exposed from the sealing portion, and the thickness of each tab is greater than the thickness of leads. Therefore, the heat radiating property of the tabs can be enhanced. As a result, the heat radiating property of the semiconductor device for driving a three-phase motor, having a plurality of chips can be enhanced.

DETAILED DESCRIPTION OF THE PREFERRED EMBODIMENTS

Figure 1:
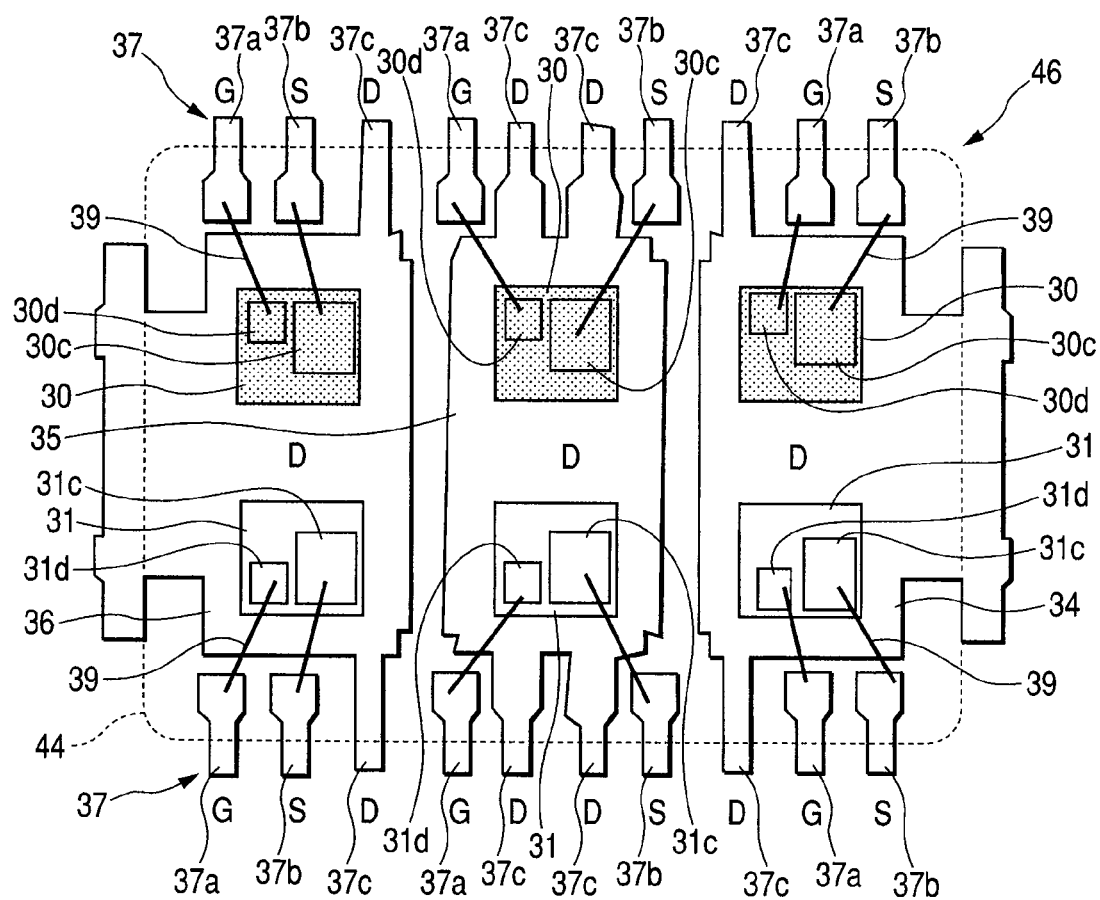
FIG. 1 is a plan view illustrating an example of the construction of a semiconductor device (for driving a three-phase motor) in a first embodiment of the invention as viewed through its sealing portion.

In the following description of embodiments, an identical or similar portion will not be repeatedly described as a rule unless the description is especially required.

In the following description of embodiments, one embodiment will be divided into plural sections or embodiments if necessary for convenience. However, they are not independent of one another but are in such relation that one is a modification to or the details, supplementary explanation, or the like of part or all of another.

In cases where a number of elements (including a number of pieces, numeric value, quantity, range, and the like) is cited in the following description of embodiments, the invention is not limited to that specific number. Any number greater or less than that specific number is acceptable. However, this does not apply when otherwise stated, when the invention is obviously limited to that specific number according to the principle, or in other like cases.

Hereafter, detailed description will be given to embodiments of the invention with reference to the drawings. In all the drawings for the explanation of embodiments, members having the same functions will be marked with the same reference numerals, and the repetitive description of them will be omitted.

First Embodiment

Figure 2:
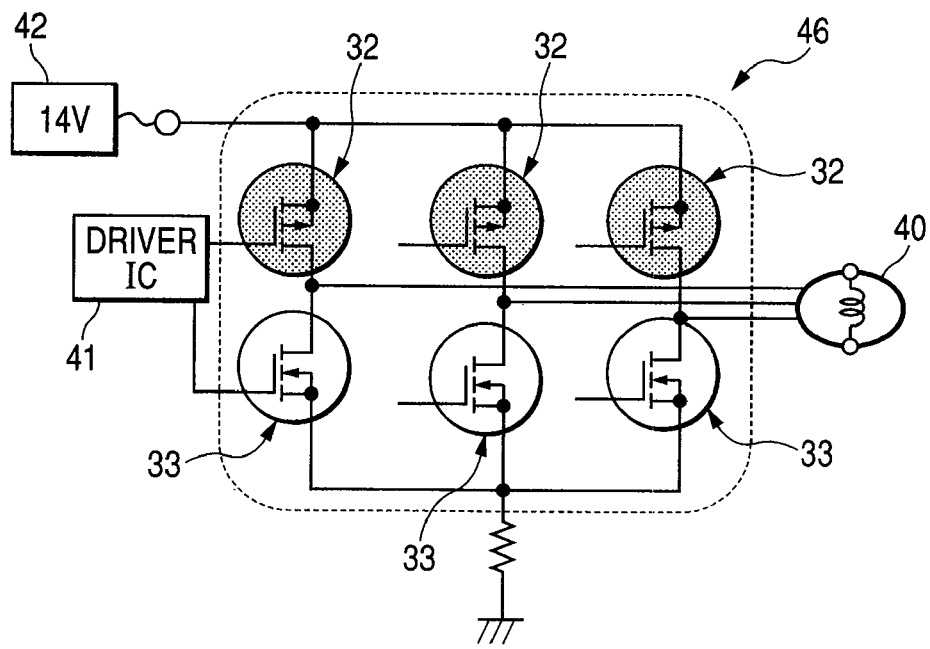
FIG. 2 is an equivalent circuit diagram illustrating an example of circuitry for driving a three-phase motor, using the semiconductor device illustrated in FIG. 1.
Figure 3:
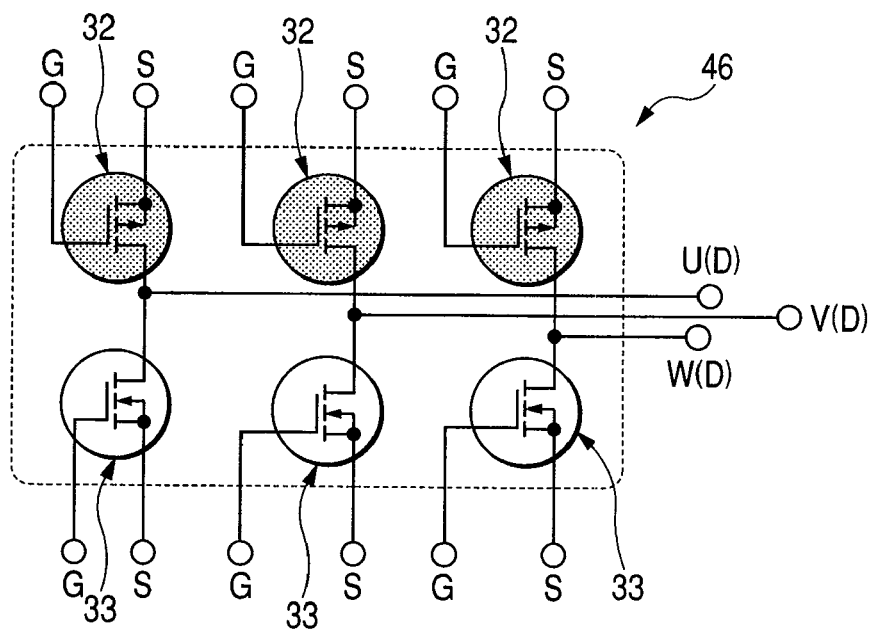
FIG. 3 is an equivalent circuit diagram illustrating an example of circuitry in which a semiconductor device in the first embodiment of the invention is applied to HSOP.
Figure 4:
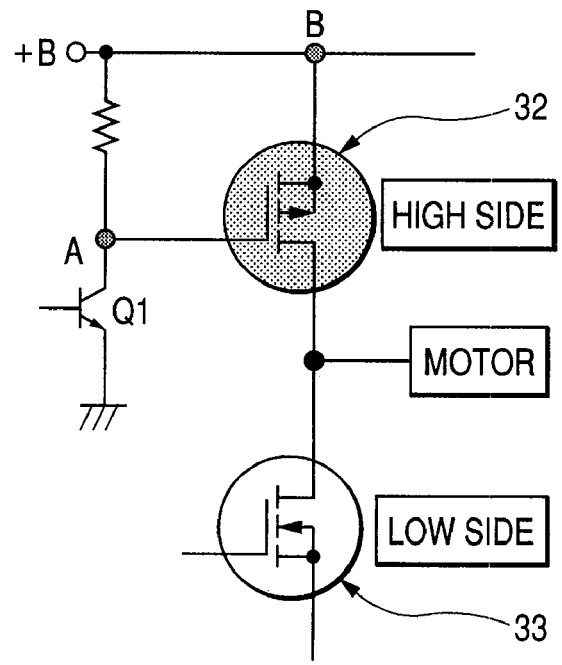
FIG. 4 is a circuitry diagram illustrating an example of the operation of a drive circuit in which n and pMISFETs are incorporated together with respect to the semiconductor device illustrated in FIG. 1.
Figure 5:
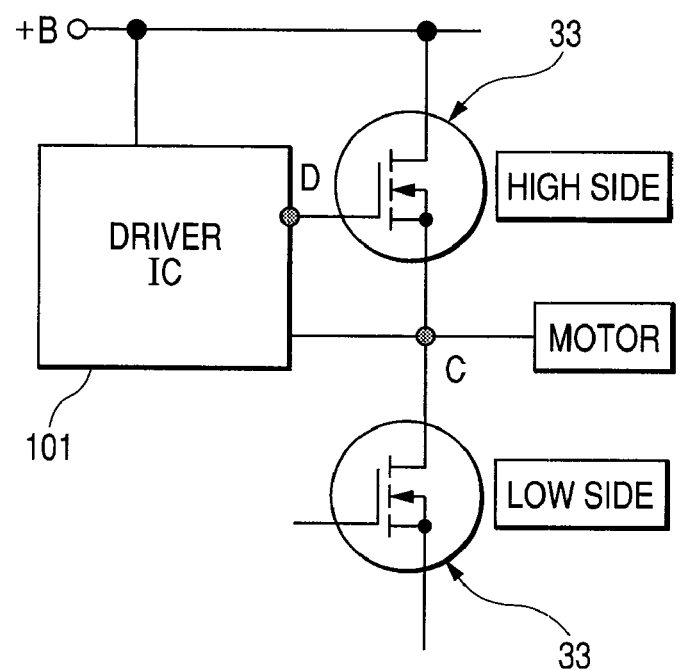
FIG. 5 is a circuitry diagram illustrating the operation of a drive circuit in which only nMISFETs are incorporated with respect to a semiconductor device in a comparative example.
Figure 6:
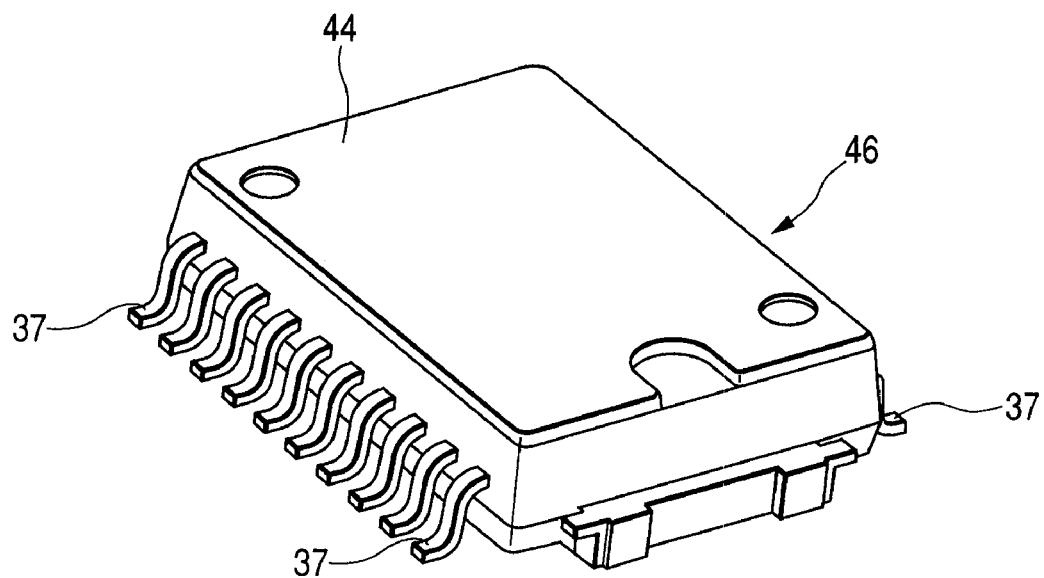
FIG. 6 is a perspective view illustrating an example of the construction of the semiconductor device illustrated in FIG. 1.
Figure 7:
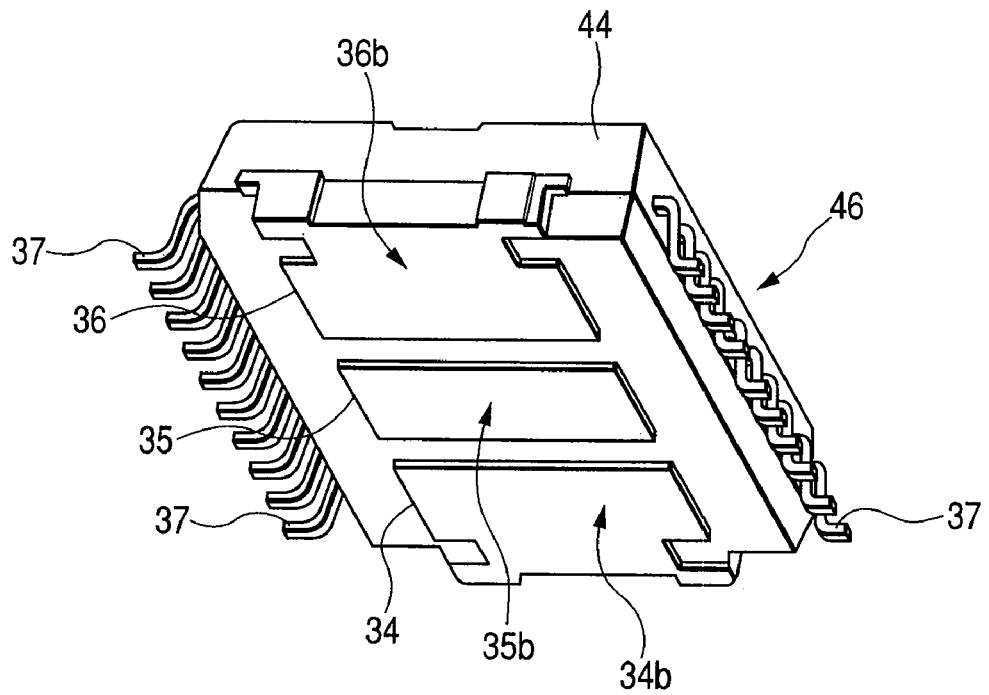
FIG. 7 is a perspective view illustrating an example of the construction of the back side of the semiconductor device illustrated in FIG. 1.
Figure 8:
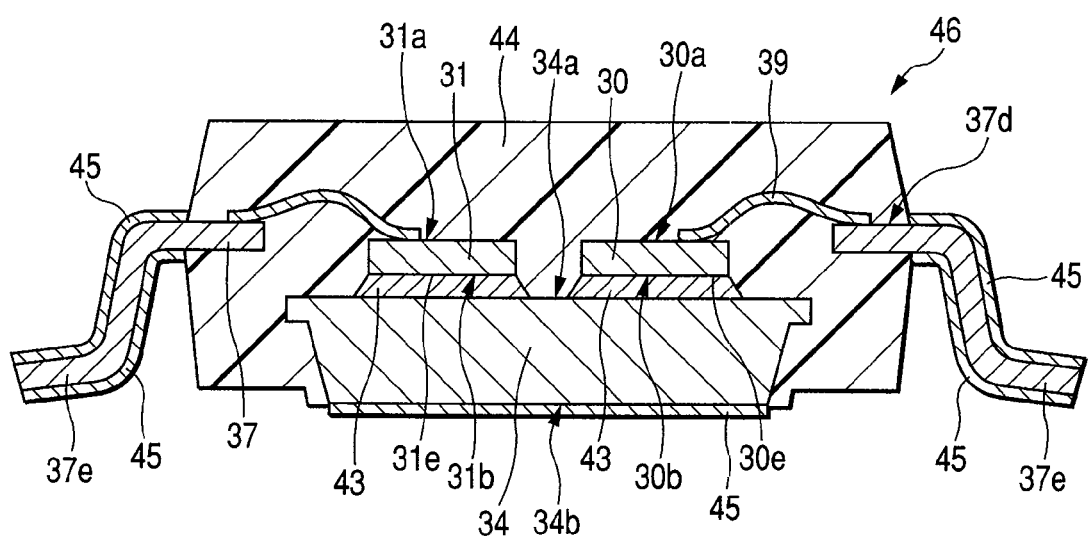
FIG. 8 is a sectional view illustrating an example of the construction of the semiconductor device illustrated in FIG. 1.
Figure 9:
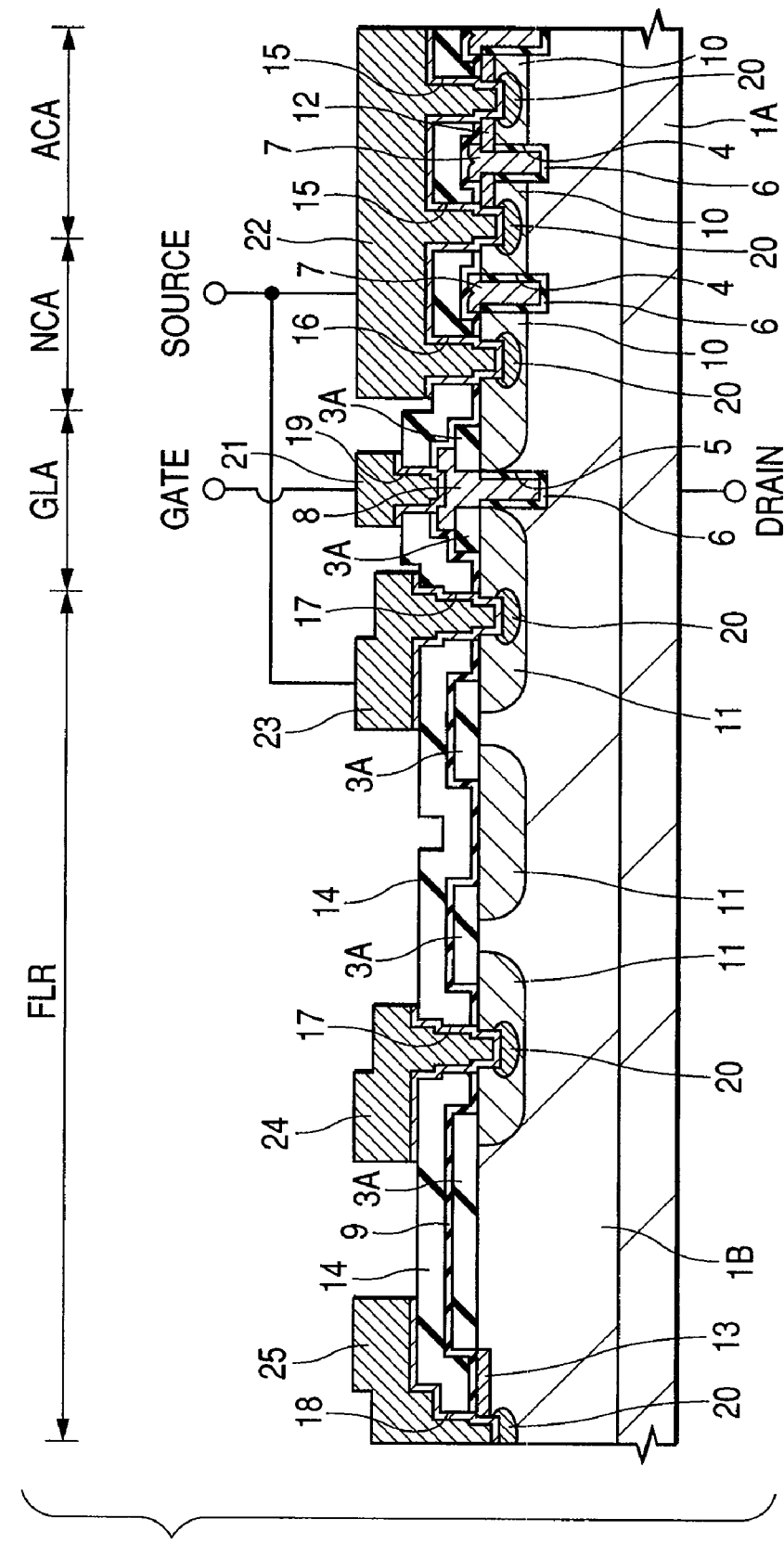
FIG. 9 is a sectional view illustrating an example of the construction of a semiconductor chip incorporated in the semiconductor device illustrated in FIG. 1.
Figure 10:
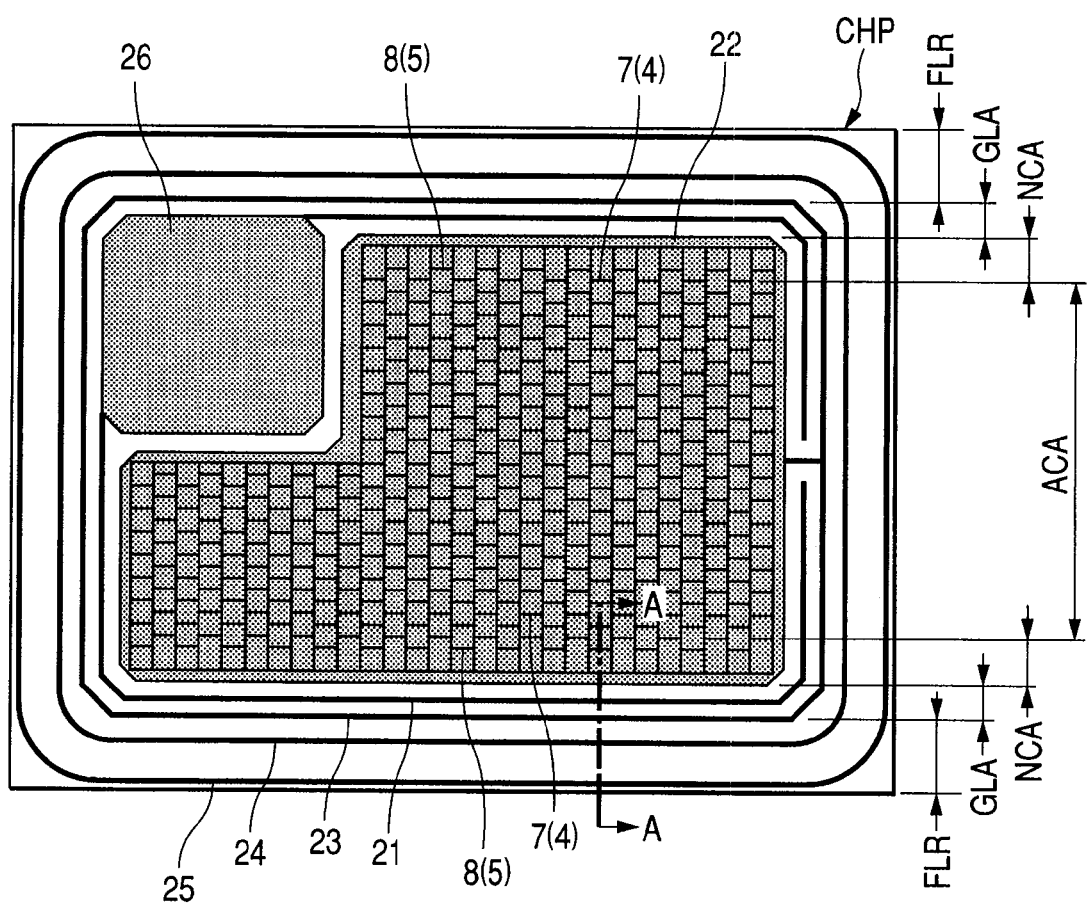
FIG. 10 is a plan view illustrating an example of the construction of the semiconductor chip illustrated in FIG. 9.
Figure 11:
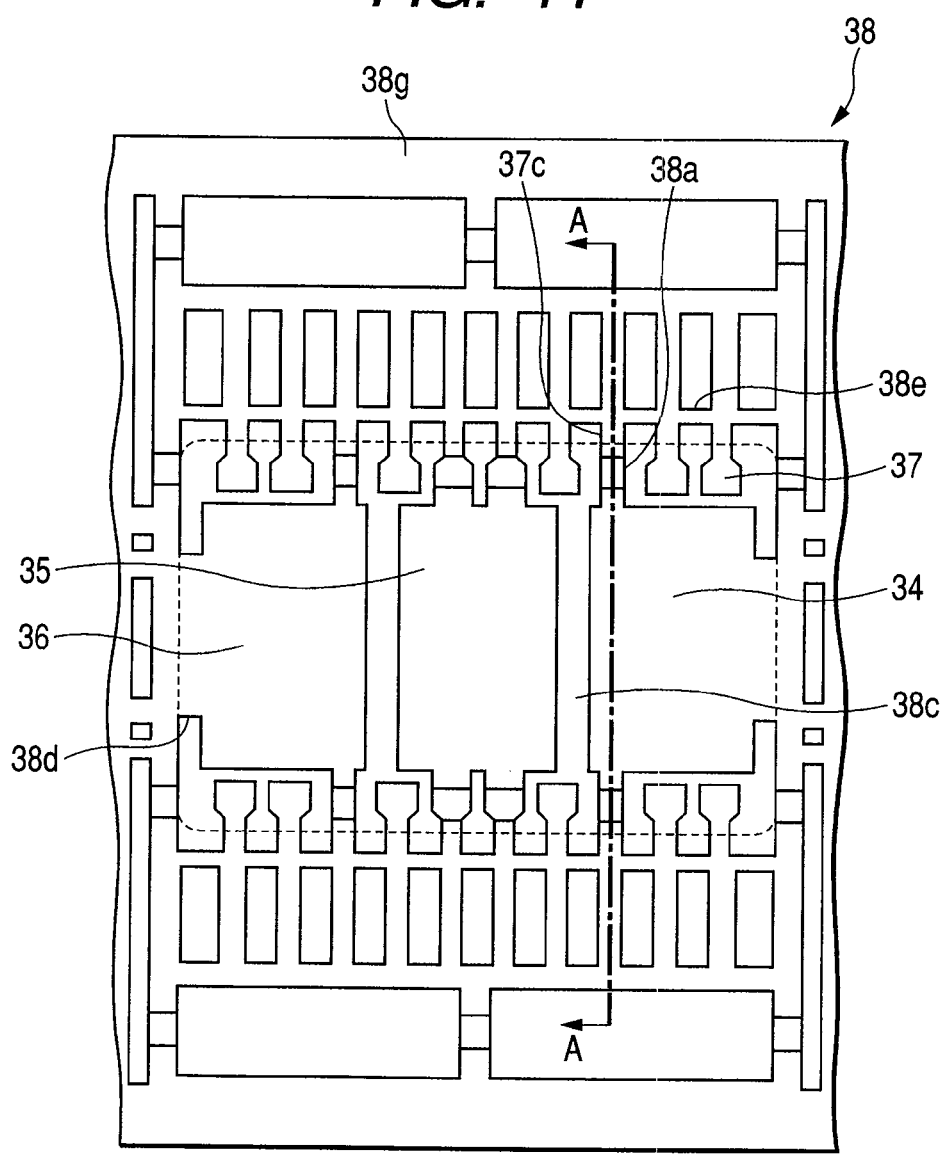
FIG. 11 is a partial plan view illustrating an example of the construction of a lead frame used in the assembly of the semiconductor device illustrated in FIG. 1.
Figure 12:
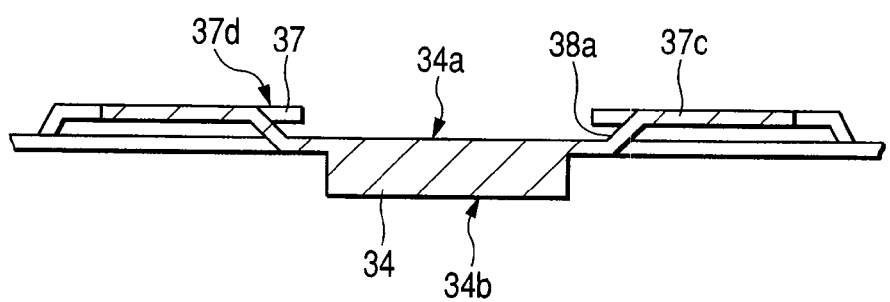
FIG. 12 is a sectional view illustrating the construction of the lead frame illustrated in FIG. 11, taken along the line A-A of FIG. 11.
Figure 13:
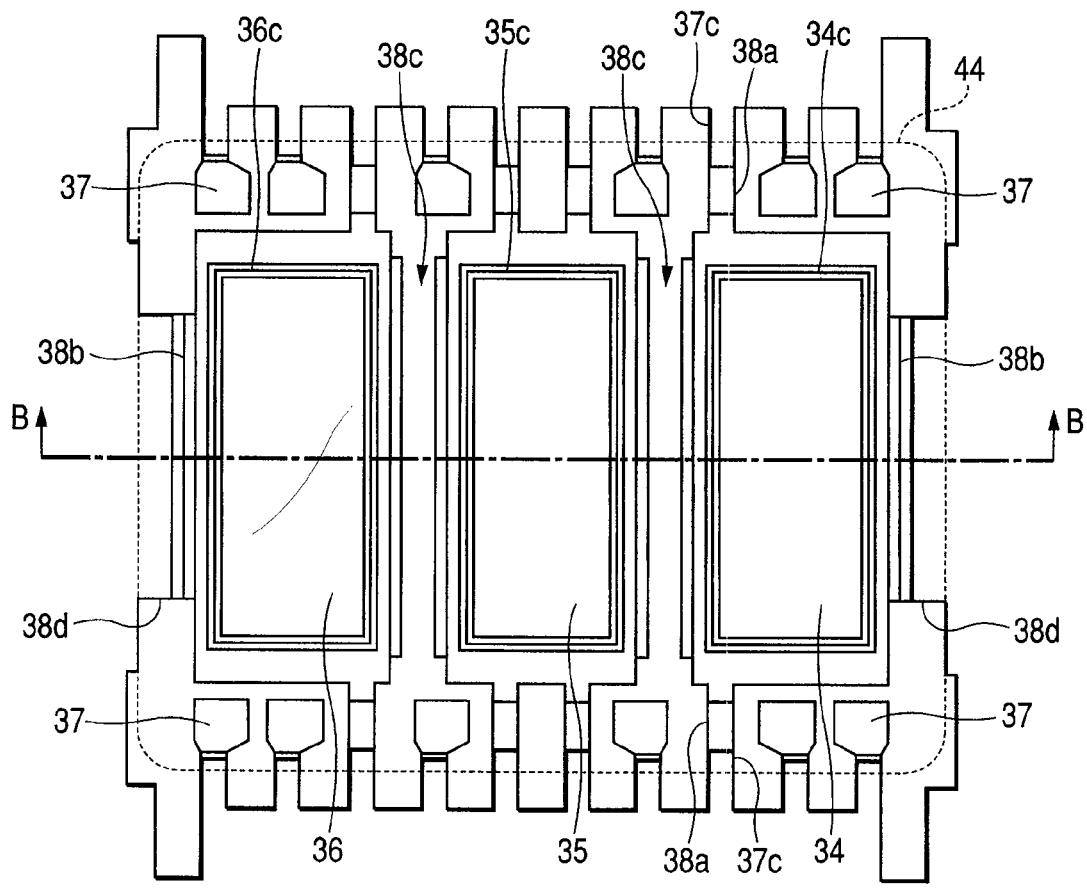
FIG. 13 is a partial plan view illustrating the construction of a principal part of the lead frame illustrated in FIG. 11.
Figure 14:
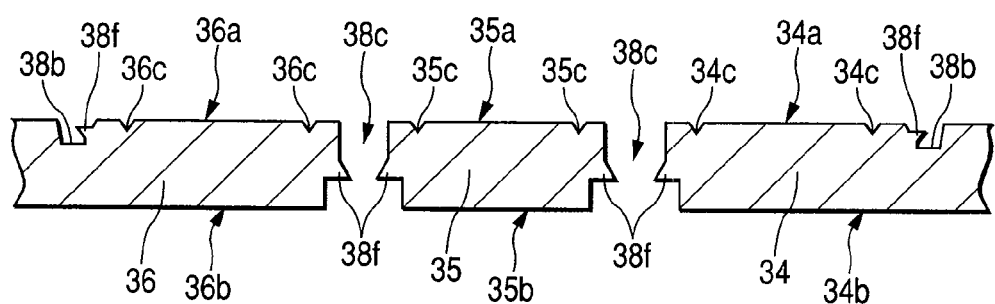
FIG. 14 is a sectional view illustrating the construction of the lead frame illustrated in FIG. 13, taken along the line B-B of FIG. 13.

FIG. 1 is a plan view illustrating an example of the construction of a semiconductor device (for driving a three-phase motor) in a first embodiment of the invention as viewed through its sealing portion; FIG. 2 is an equivalent circuit diagram illustrating an example of circuitry for driving a three-phase motor, using the semiconductor device illustrated in FIG. 1; FIG. 3 is an equivalent circuit diagram illustrating an example of circuitry in which a semiconductor device in the first embodiment of the invention is applied to HSOP; and FIG. 4 is a circuitry diagram illustrating an example of the operation of a drive circuit in which n and pMISFET are incorporated together with respect to the semiconductor device illustrated in FIG. 1. FIG. 5 is a circuitry diagram illustrating the operation of a drive circuit in which only nMISFETs are incorporated with respect to a semiconductor device in a comparative example; FIG. 6 is a perspective view illustrating an example of the construction of the semiconductor device illustrated in FIG. 1; FIG. 7 is a perspective view illustrating an example of the construction of the back side of the semiconductor device illustrated in FIG. 1; FIG. 8 is a sectional view illustrating an example of the construction of the semiconductor device illustrated in FIG. 1; FIG. 9 is a sectional view illustrating an example of the construction of a semiconductor chip incorporated in the semiconductor device illustrated in FIG. 1; and FIG. 10 is a plan view illustrating an example of the construction of the semiconductor chip illustrated in FIG. 9. FIG. 11 is a partial plan view illustrating an example of the construction of a lead frame used in the assembly of the semiconductor device illustrated in FIG. 1; FIG. 12 is a sectional view illustrating the construction of the lead frame illustrated in FIG. 11, taken along the line A-A of FIG. 11; FIG. 13 is a partial plan view illustrating the construction of a principal part of the lead frame illustrated in FIG. 11; and FIG. 14 is a sectional view illustrating the construction of the lead frame illustrated in FIG. 13, taken along the line B-B of FIG. 13.

Figure 15:
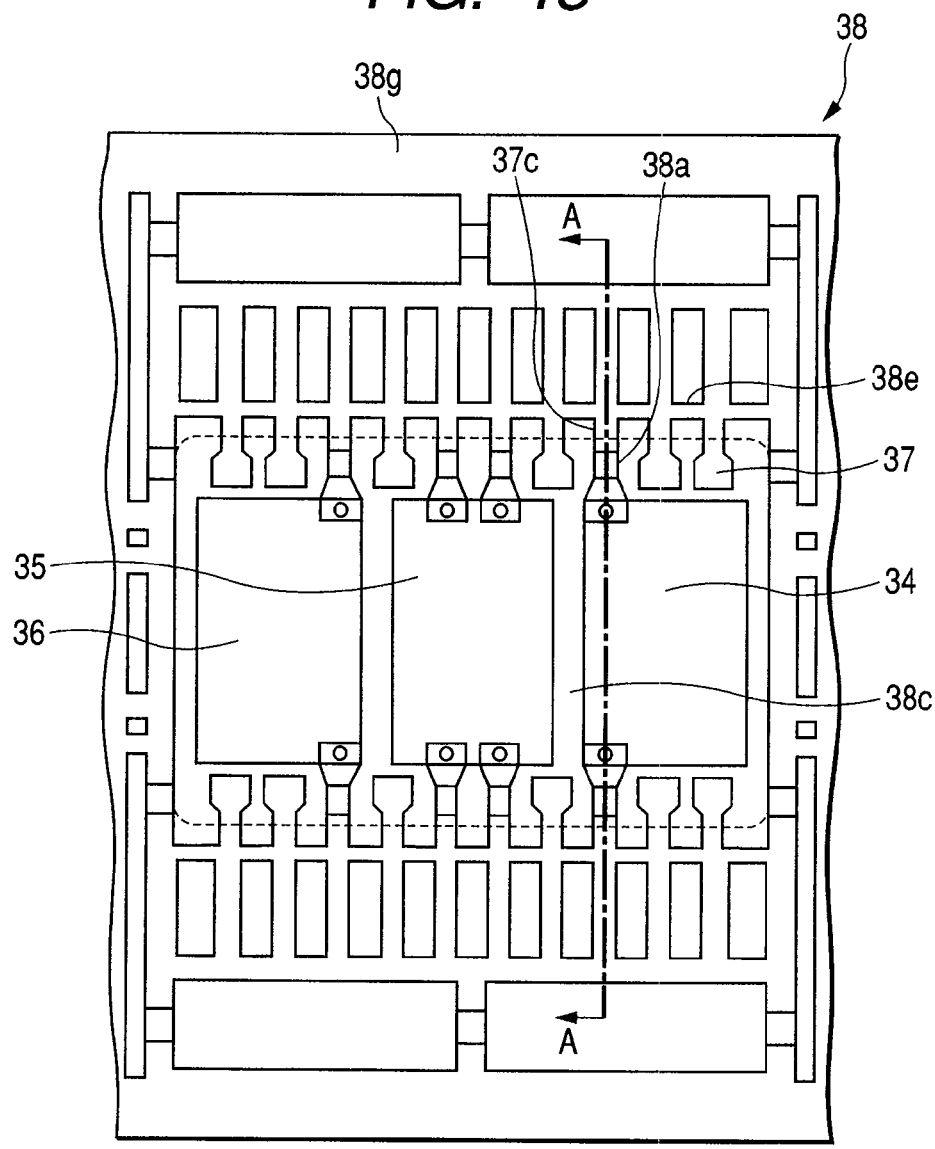
FIG. 15 is a partial plan view illustrating the construction of a lead frame in a modification to the first embodiment of the invention.
Figure 16:
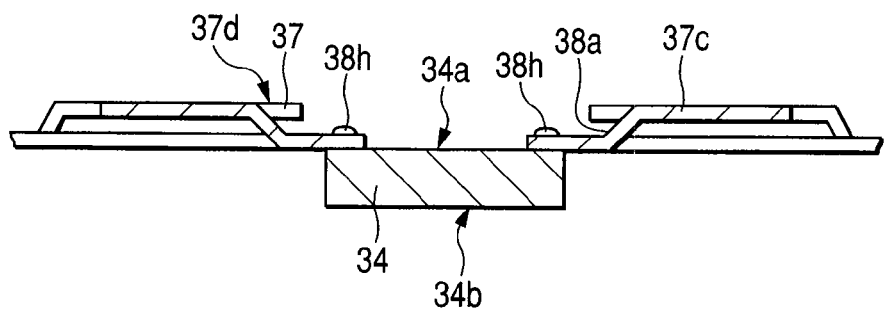
FIG. 16 is a sectional view illustrating the construction of the lead frame illustrated in FIG. 15, taken along the line A-A of FIG. 15.
Figure 17:
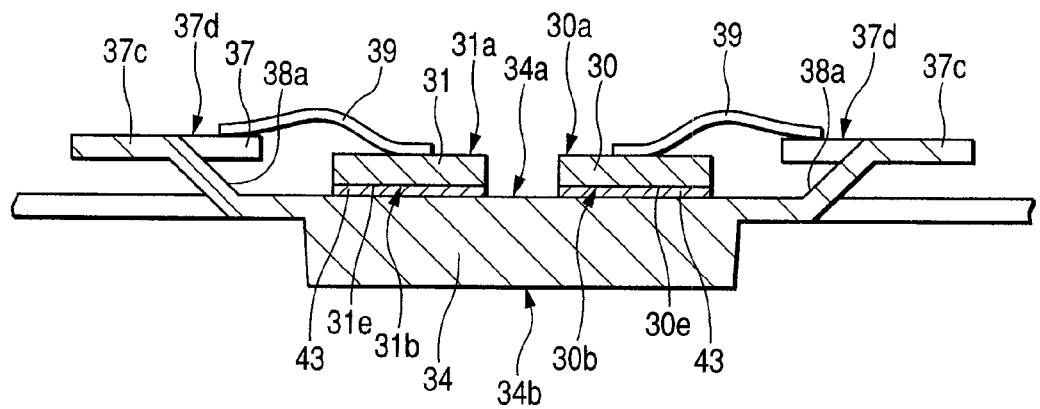
FIG. 17 is a partial sectional view illustrating an example of the construction of the semiconductor device illustrated in FIG. 1 after wire bonding in its assembly.
Figure 18:
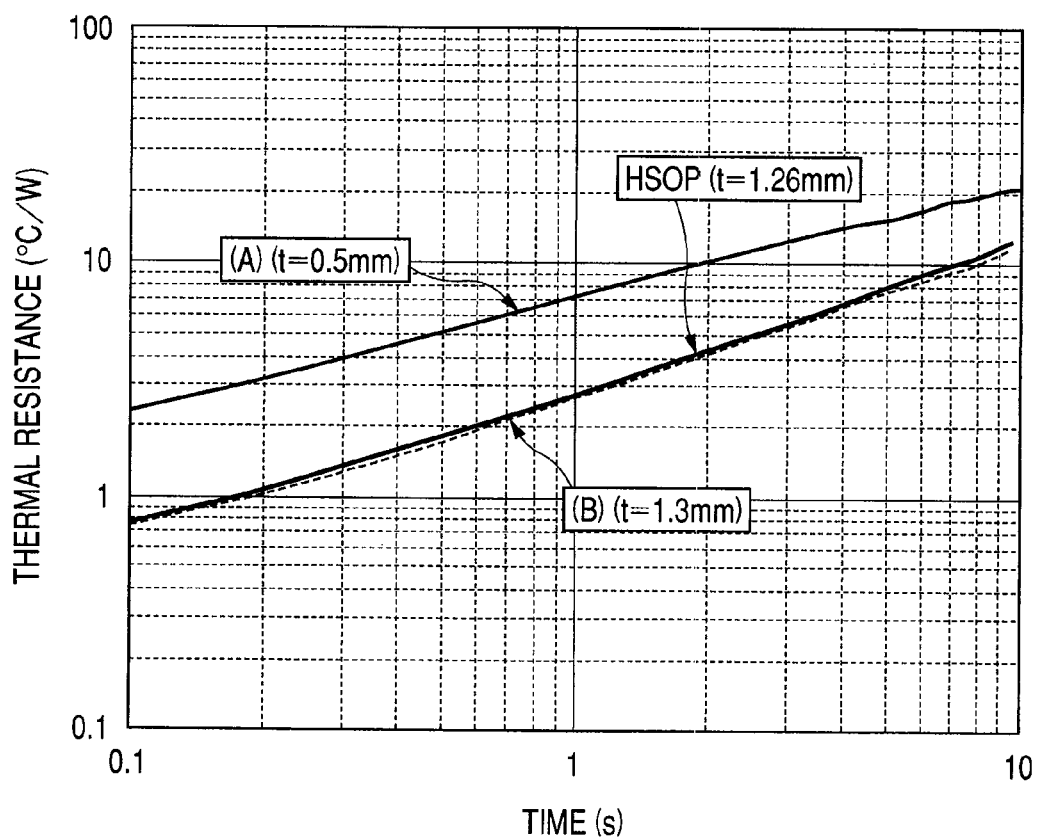
FIG. 18 is a thermal resistance data diagram illustrating an example of the actual measurement data about thermal resistance due to the plate thickness of a tab in a semiconductor device in the first embodiment of the invention.

FIG. 15 is a partial plan view illustrating the construction of a lead frame in a modification to the first embodiment of the invention; FIG. 16 is a sectional view illustrating the construction of the lead frame illustrated in FIG. 15, taken along the line A-A of FIG. 15; FIG. 17 is a partial sectional view illustrating an example of the construction of the semiconductor device illustrated in FIG. 1 after wire bonding in its assembly; and FIG. 18 is a thermal resistance data diagram illustrating an example of the actual measurement data about thermal resistance due to the plate thickness of a tab in a semiconductor device in the first embodiment of the invention.

The semiconductor device in the first embodiment is a semiconductor package for driving a three-phase motor. It is of multichip structure and has a plurality of semiconductor chips each having a MISFET incorporated in it.

The above semiconductor device is of high heat radiation type. In the description of the first embodiment, the HSOP (Heat Sink Small Outline Package) 46 illustrated in FIG. 1 will be taken as an example of the above semiconductor device. Such a semiconductor device is used for in-vehicle applications, for example. However, its applications are not limited to in-vehicle applications but it may be used to drive a common motor or the like.

The HSOP 46 is a semiconductor package for driving a three-phase motor. As illustrated in FIG. 2, therefore, it has three sets of circuits for driving, each set composed of a p-channel MISFET (hereafter, referred to as "pMISFET") 32 and an n-channel MISFET (hereafter, referred to as "nMISFET") 33, in correspondence with three phases. It drives a motor 40 in three phases by power supply 42 and a signal from a driver IC (Integrated Circuit) 41.

As illustrated in FIG. 3, the HSOP 46 has three pMISFETs 32 on the high-supply voltage side (high side) and three nMISFETs 33 on the low-supply voltage side (low side). It drives the motor 40 in three phases by the six MISFETs in total. That is, it has three sets of circuits for driving, each set composed of a pMISFET 32 and an nMISFET 33. It causes signals in phases U, V, and W to be individually outputted from drains by the respective circuits, and thus drives the motor 40 in three phases. Therefore, the HSOP 46 is a semiconductor device in which p and nMISFETs are incorporated together.

The pMISFETs 32 and nMISFETs 33 are those with low breakdown voltage, and their voltage between source and drain is lower than 100V (VDSS<100V).

The HSOP 46 in the first embodiment has three tabs (first tab 34, second tab 35, and third tab 36) divided in correspondence with the number of phases (three phases) of the motor 40 as illustrated in FIG. 1. One set of a pMISFET 32 and an nMISFET 33 is mounted over each tab. One set of a first semiconductor chip 30 including a pMISFET 32 and a second semiconductor chip 31 including an nMISFET 33 is mounted over each of the main surfaces 34a, 35a, and 36a of the first tab 34, second tab 35, and third tab 36. (Refer to FIG. 14.)

The three first semiconductor chips 30 each including a pMISFET 32 are placed on the high side and the three second semiconductor chips 31 each including an nMISFET 33 placed on the low side.

The source pads 30c formed over the main surfaces 30a of the first semiconductor chips 30 are electrically connected with corresponding leads 37b for source through conductive wires 39. The gate pads 30d similarly formed are electrically connected with corresponding leads 37a for gate through conductive wire 39. As illustrated in FIG. 8, the back sides 30b of the first semiconductor chips form drain pads 30e. These drain pads 30e are electrically connected with tabs through solder 43. Further, leads 37c for drain (some of the leads 37) and the tabs are integrally joined with each other.

Similarly, the source pads 31c formed over the main surfaces 31a of the second semiconductor chips 31 are electrically connected with corresponding leads 37b for source through conductive wires 39. The gate pads 31d similarly formed are electrically connected with corresponding leads 37a for gate through conductive wires 39. As illustrated in FIG. 8, the back sides 31b of the second semiconductor chips 31 form drain pads 31e. These drain pads 31e are electrically connected with tabs through solder 43. Further, the tabs and leads 37c for drain (some of the leads 37) are integrally joined with each other.

Therefore, the first semiconductor chip 30 and second semiconductor chip 31 over the first tab 34 share a drain electrode between them over the tab; the first semiconductor chip 30 and second semiconductor chip 31 over the second tab 35 share a drain electrode between them over the tab; and the first semiconductor chip 30 and second semiconductor chip 31 over the third tab 36 share a drain electrode between them over the tab.

That is, the first tab 34, second tab 35, and third tab 36 are respectively electrically connected with the drains of a pMISFET 32 and an nMISFET 33. The drains of the pMISFETs 32 and the nMISFETs 33 are electrically connected with each other through each of the first tab 34, second tab 35, and third tab 36.

However, the drain electrodes of MISFETs are not electrically short-circuited between phases because a tab is divided into three in correspondence with the number of phases of the motor 40.

FIG. 1 illustrates the disposition (G, S, D) of the plurality of leads 37 composed of leads 37a for gate, leads 37b for source, and leads 37c for drain as an example. However, the disposition of the leads is not limited to that illustrated in FIG. 1.

A comparison will be made between a drive circuit with p and nMISFETs incorporated together and a high-side drive circuit with nMISFETs only incorporated with reference to FIG. 4 (first embodiment) and FIG. 5 (comparative example).

FIG. 4 illustrates an example of a drive circuit with p and nMISFETs incorporated together, adopted in the HSOP in the first embodiment. FIG. 5 illustrates a high-side drive circuit with nMISFETs only incorporated as a comparative example.

As illustrated FIG. 4, the pMISFET 32 can operate as the result of the following: Q1 operates and thus the voltage at point A (gate) becomes lower than the potential at point B (source). That is, the drive circuit with p and nMISFETs incorporated together, illustrated in FIG. 4, can be operated with very simple circuitry.

To operate the nMISFET 33 in the drive circuit in FIG. 5 as a comparative example, the voltage at point D (gate) must be higher than the potential at point C (source). Since point C is at substantially the same potential as +B during operation, however, a driver IC 101 provided with a booster circuit for making the potential at point D higher than that at point C. Therefore, a drive circuit with nMISFETs only incorporated inevitably uses IC, and this complicates the circuit.

Therefore, the drive circuit with p and nMISFETs incorporated together, adopted in the first embodiment can be constructed with more simple circuitry as compared with the drive circuit with nMISFETs only incorporated as a comparative example. Therefore, the circuit with p and nMISFETs incorporated together allows footprints to be reduced.

Description will be given to the details of the construction of the HSOP 46 in the first embodiment. It has the first tab 34, second tab 35, and third tab 36, which are tabs divided into three in correspondence with three phases. As illustrated in FIG. 1, a first semiconductor chip 30 including a pMISFET 32 and a second semiconductor chip 31 including an nMISFET 33 are mounted over each tab.

The individual semiconductor chips are electrically connected with corresponding leads 37 through wires 39. More specific description will be given. The gate pads 30d of the first semiconductor chips 30 and the gate pads 31d of the second semiconductor chips 31 are electrically connected with respective corresponding leads 37a for gate through wires 39. The source pads 30c of the first semiconductor chips 30 and the source pads 31c of the second semiconductor chips 31 are electrically connected with respective corresponding leads 37b for source through wires 39.

The drain pads 30e of the first semiconductor chips 30 and the drain pads 31e of the second semiconductor chips are electrically connected with respective tabs through solder 43.

Parts of the first tab 34, second tab 35, third tab 36, and a plurality of leads 37, the first semiconductor chips 30, and the second semiconductor chips 31 are plastic molded with a sealing portion 44 formed of sealing resin.

As illustrated in FIG. 7, the respective back sides 34b, 35b, and 36b of the first tab 34, second tab 35, and third tab 36 are exposed at the underside of the sealing portion 44. As illustrated in FIG. 8 and FIG. 14, the respective thickness of the first tab 34, second tab 35, and third tab 36 is larger than the thickness of the leads 37 (twice to three times or so).

As mentioned above, parts (back sides 34b, 35b, and 36b) of the individual tabs that also function as drain terminals are exposed at the underside of the sealing portion 44. Each tab is so formed that it is thicker than the leads 37. As a result, each tab can be provided with a heat sink function to enhance the heat radiating property of the HSOP 46.

FIG. 18 illustrates an example of the relation between time and thermal resistance with various tab thicknesses taken as a parameter by actual measurement data. In case of (B) in which the tab is thick (t=1.3 mm) or in case of HSOP (t=1.26 mm), the thermal resistance is lower than in case of (A) in which the tab is thin (t=0.5 mm). Therefore, the heat radiating property of the HSOP 46 can be enhanced by adopting a thick tab (heat sink). An example of (A) is a surface mount MOSFET, and an example of (B) is a large surface mount MOSFET.

As illustrated in FIG. 8, the wire bonding faces 37d of the individual plural leads 37 are disposed that they are farther from the respective tabs than the tabs' main surfaces 34a, 35a, and 36a on the main surface side. More specific description will be given. Some of the leads 37 (the leads 37c for drain) are stepped, and thus the wire bonding faces 37d of the leads 37 are so disposed that they are higher than the main surfaces 34a, 35a, and 36a of the individual tabs.

Therefore, the wires 39 can be prevented from being brought into contact with an edge of the main surface of a chip. Thus, the wires 39 can be prevented from being short-circuited to a first semiconductor chip 30 or a second semiconductor chip 31.

A plurality of outer leads 37e of the plural leads 37 protruding from side faces of the sealing portion 44 are bent into gull wing shape as illustrated in FIG. 6 and FIG. 8. The surfaces of the outer leads 37e and the back sides 34b, 35b, and 36b of the tabs are coated with solder plating 45 as outer plating.

The first semiconductor chips 30 and the second semiconductor chips 31 are formed of silicon, for example. The tabs and the leads are formed of copper alloy, for example. The wires 39 are aluminum wires or gold wires, for example. The solder 43 as die bond material is high-melting point solder, for example. Resin paste may be used as die bond material, or Au—Si eutectic bonding may be used. The sealing resin for forming the sealing portion 44 is epoxy resin, for example.

Description will be given to the configuration of a semiconductor chip incorporated into the HSOP 46 in the first embodiment with reference to FIG. 9 and FIG. 10. Here, the configuration of a semiconductor chip including an nMISFET 33 will be described as an example.

As illustrated in FIG. 9, this semiconductor chip is formed by preparing a semiconductor substrate (hereafter, simply referred to as "substrate") obtained by the following processing: an $n^-$-type single-crystal silicon layer 1B doped with impurity of n conductivity type is epitaxially grown over the surface of an $n^+$-type single-crystal silicon substrate 1A of n conductivity type. This substrate includes: an active cell area ACA in which the active cell of a power MISFET is formed; an inactive cell area NCA in which an inactive cell is formed; a gate wiring area GLA in which wiring electrically connected with the gate electrode of the power MISFET is formed; and a termination area FLR in which field limiting rings are formed. The $n^+$-type single-crystal silicon substrate 1A and the $n^-$-type single-crystal silicon layer 1B form the drain region of the power MISFET.

There are trenches 4 formed in the active cell area ACA and the inactive cell area NCA, and there is a trench 5 formed in the gate wiring area GLA. The substrate is subjected to thermal oxidation, and a silicon oxide film 6 is formed on the side walls and bottom of the trenches 4 and 5. This silicon oxide film 6 is the gate insulating film of the power MISFET.

A field insulating film 3A is formed over the $n^-$-type single-crystal silicon layer 1B, and a silicon oxide film 9 is deposited over the film.

Further, contact grooves 15, 16, 17, and 18 are formed in an insulating film 14, and a $p^+$-type semiconductor region 20 is formed at the bottom of the contact grooves 15, 16, 17, and 18. This $p^+$-type semiconductor region 20 is for bringing the wiring into ohmic contact with $p^-$-type semiconductor regions 10 or $p^-$-type field limiting rings 11 at the bottom of the contact grooves 15, 16, 17, and 18.

In the semiconductor chip, a thin TiW (titanium tungsten) film as a barrier conductor film is deposited over the insulating film 14 including the interior of the contact grooves 15, 16, 17, 18, and 19 by sputtering, for example. Further, an Al (aluminum) film is formed over the film. The barrier conductor film functions to prevent an undesired reaction layer from being formed by contact between Al and the substrate (Si).

The Al film means a film predominantly composed of Al, and it may contain any other metal or the like.

The TiW film and the Al film are etched, and the following are formed: a gate wiring 21 electrically connected with a gate lead-out electrode 8; a source pad (source electrode) 22 electrically connected with an $n^+$-type semiconductor region 12 that forms the source region of the power MISFET; and a wiring 23 that is electrically connected with one of the $p^-$-type field limiting rings 11 and is electrically connected with the source pad 22 in a region not shown in FIG. 9. Further, the following are formed: a wiring 24 electrically connected with a $p^-$-type field limiting ring 11 that is different from the $p^-$-type field limiting ring 11 electrically connected with the wiring 23; a wiring 25 electrically connected with an $n^+$-type guard ring region 13; and a gate pad (gate electrode) electrically connected with the gate wiring 21.

When a plan view is drawn illustrating the way the gate wiring 21, source pad 22, wirings 23, 24, and 25, and gate pad are formed, that is as illustrated in FIG. 10. FIG. 10 illustrates a chip section CHP equivalent to one chip obtained by dividing a substrate into individual chips. The section illustrated in FIG. 9 shows the section of this chip section taken along the line A-A.

In the chip section CHP (planar surface), as illustrate in FIG. 10, the active cell area ACA, inactive cell area NCA, gate wiring area GLA, and termination area FLR are so formed that the following is implemented: the inactive cell area NCA encircles the active cell area ACA; the gate wiring area GLA encircles the inactive cell area NCA; and the termination area FLR encircles the gate wiring area GLA.

The $n^+$-type semiconductor region 12 that forms the source of a power MISFET in the first embodiment is formed in the active cell area ACA and is not formed in the inactive cell area NCA. In cases where the $n^+$-type semiconductor region 12 is also formed in the inactive cell area NCA, a parasitic MISFET is formed in which: the $n^+$-type single-crystal silicon substrate 1A and the $n^-$-type single crystal silicon layer 1B are a drain region; the $n^+$-type semiconductor region 12 is a source region; the gate lead-out electrode 8 is a gate electrode; and the $p^-$-type semiconductor regions 10 are channels.

As mentioned above, the gate electrode 7 and the gate lead-out electrode 8 are integrally formed and electrically connected with each other. Consequently, the following trouble can occur: when the power MISFET is operated, this parasitic MISFET also operates, and electro-current constriction occurs in a cell in proximity to the peripheral area of the chip. To cope with this, the first embodiment adopts the following construction: the power MISFET cell formed in the active cell area ACA is encircled with the inactive cell area NCA in which a dummy cell with no $n^+$-type semiconductor region 12 present is formed. Thus, parasitic operation due to such a parasitic MISFET can be prevented. The trouble of an occurrence of electro-current constriction in a cell in proximity to the peripheral area of the power MISFET chip can be thereby prevented.

As illustrated in FIG. 10, the planar pattern of gate electrodes 7 (trenches 4) in the first embodiment is of rectangular mesh. The source pad 22 formed over the gate electrodes 7 is electrically connected with the wiring 23. A gate pad (gate electrode) 26 is formed of the same wiring layer as the gate wiring 21, source pad 22, and wirings 23, 24, and 25 are, and is electrically connected with the gate wiring 21. The wiring 25 electrically connected with the $n^+$-type guard ring region 13 and the wiring 24 and wiring 25 electrically connected with the $p^-$-type field limiting rings 11 are sequentially disposed from the outermost area of the chip section so that the active cell area ACA is encircled with them.

In the semiconductor device (HSOP 46) in the first embodiment, the following is implemented in the HSOP 46 for driving a three-phase motor: a first semiconductor chip 30 including a pMISFET 32 and a second semiconductor chip 31 including an nMISFET 33 are mounted over each of the first tab 34, second tab 35, and third tab 36. The drains of the pMISFET 32 and nMISFET 33 over each tab are electrically connected with each other. Thus, the HSOP 46 can be reduced in size.

More specific description will be given. Two of six semiconductor chips each including MISFET are placed over each of three tabs divided in correspondence with the number of phases of the motor 40. These chips are packaged in one in a compact manner. This makes it possible to reduce the size of the semiconductor device (HSOP 46) for driving a three-phase motor, having a plurality of chips.

The respective back sides 34b, 35b, and 36b of the first tab 34, second tab 35, and third tab 36 that also function as drain terminals are exposed at the underside of the sealing portion 44. Further, each tab is so formed that it is far thicker than the leads 37. Thus, each tab can be provided with a heat sink function to enhance the heat radiating property of the HSOP 46.

As a result, the heat radiating property of the semiconductor device (HSOP 46) for driving a three-phase motor, having a plurality of chips can be enhanced.

The HSOP 46 in the first embodiment is a semiconductor device of such construction that p and nMISFETs are incorporated together. Description will be given to the effect obtained by this embodiment through comparison with the semiconductor device (HSOP 100) illustrated as a comparative example in FIG. 25. This semiconductor device has nMISFETs only incorporated and is so constructed that a tab is divided into four.

In the above description, the drive circuit with p and nMISFETs incorporated together, illustrated in FIG. 4, was compared with the drive circuit with nMISFETs only incorporated, illustrated as a comparative example in FIG. 5. As described through comparison, the drive circuit with p and nMISFETs incorporated together has an advantage that it can be operated with simpler circuitry.

The size of divided tabs is uniform in the HSOP 46 illustrated in FIG. 1 as compared with that of the comparative example. Heat produced by each tab is uniform, and this makes it possible to enhance the reliability of the system. Meanwhile, the HSOP 100 with nMISFETs only incorporated, illustrated as a comparative example in FIG. 25, involves the following problem. The common tab 50 for drain is much larger than the other tabs, and heat produced by each tab cannot be made uniform and the enhancement of reliability is difficult to accomplish.

Figure 25:
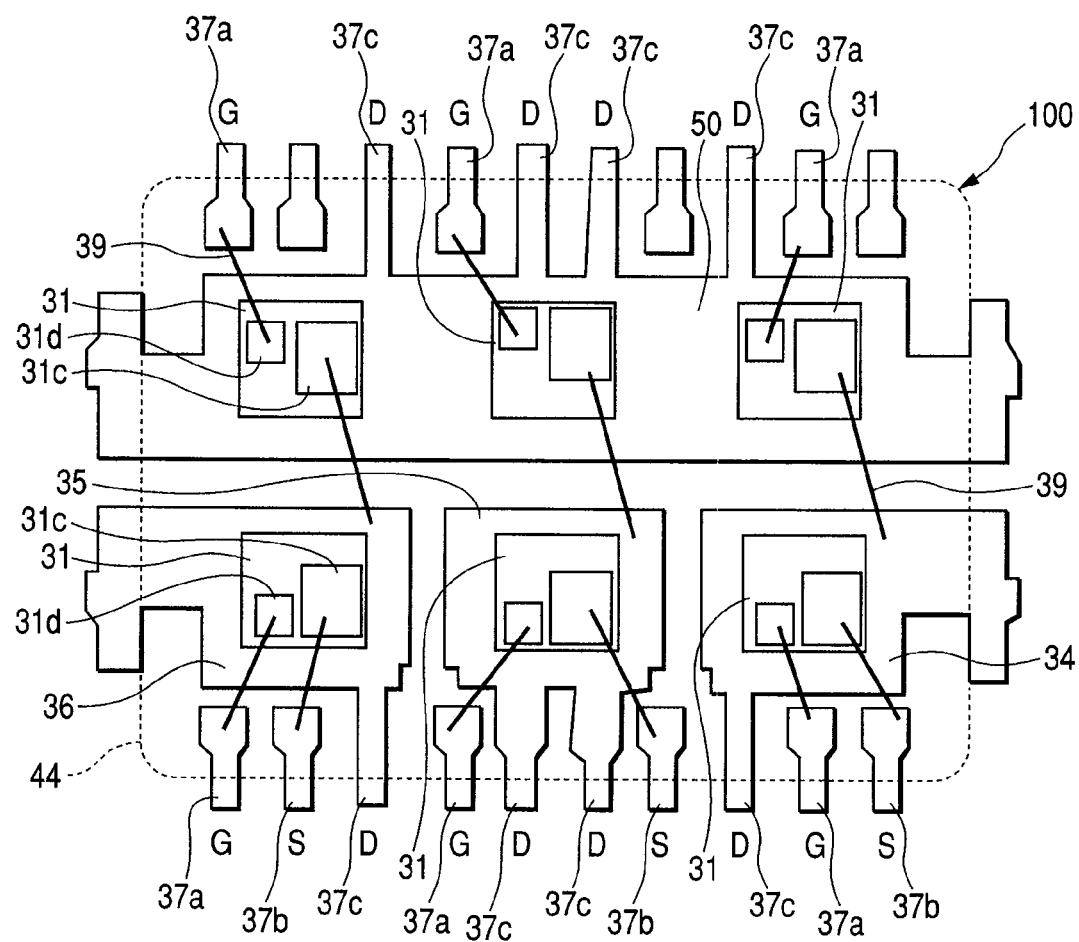
FIG. 25 is a plan view illustrating the construction of a semiconductor device (HSOP mounted only with nMISFETs) in a comparative example as viewed through its sealing portion.

In the HSOP 100 illustrated as a comparative example in FIG. 25, the source electrodes of the high-side MISFETs and the drain electrodes of the low-side MISFETs are connected with each other through wires 39 astride tabs. As a result, it is difficult to inspect erroneous connection between tabs (due to sticking solder or the like). When voltage is applied to between tabs in this case, any MISFET is almost short-circuited, and lets a current through it. In the HSOP 46 in the first embodiment illustrated in FIG. 1, the individual tabs are completely separated from one another, and can be easily inspected for erroneous connection between tabs.

In the HSOP 100 illustrated as a comparative example in FIG. 25, wires 39 are bonded to tabs, and thus bonding areas for wires 39 must be ensured in the tabs. This imposes limitation on chip size. In case of the HSOP 46 in the first embodiment illustrated in FIG. 1, wires 39 are not connected to tabs.

Therefore, the chip size can be increased as long as the tab size permits. This is highly advantageous in terms of commercialization and assembling operation.

In the HSOP 100 illustrated as a comparative example in FIG. 25, wires 39 are bonded astride tabs. Therefore, the switching noise of a low-side MISFET gets into the source electrode of a high-side MISFET via the inductance of a wire 39, and shifts a potential. As a result, the risk that its gate electrode is caused to malfunction is increased.

In case of the HSOP 46 in the first embodiment illustrated in FIG. 1, tabs are completely separated from one another. Therefore, they are not affected by one another, and the reliability of the system can be enhanced.

Description will be given to the assembly of the HSOP 46 (semiconductor device) in the first embodiment.

FIG. 11 and FIG. 12 illustrate the configuration of a substantial part of a lead frame 38 used in the assembly of the HSOP 46.

The lead frame 38 is provided in one package region with a first tab 34, second tab 35, and third tab 36, which are three tabs divided in correspondence with the number of phases of the motor 40. A plurality of leads 37 are provided around them. The first tab 34, second tab 35, and third tab 36 are divided by slits 38c formed between them.

Each of the plurality of leads 37 is supported by adjacent leads 37 and a dam bar 38e, and of the plurality of leads 37, the leads 37c for drain are integrally joined with the respective tabs. More specific description will be given. Each tab is so constructed that a drain electrode is shared between two semiconductor chips mounted over it. Therefore, the tabs are integrally joined with the leads 37c for drain and supported by the leads 37c for drain.

As illustrated in FIG. 12, each lead 37c for drain is bent and provided with a stepped portion 38a. Thus, the wire bonding faces 37d of the individual leads 37, including the leads 37c for drain, are so disposed that they are farther from the tabs than the main surfaces 34a, 35a, and 36a of the tabs on the main surface side. That is, the wire bonding faces 37d of the individual leads 37 are disposed at a higher level than the main surfaces 34a, 35a, and 36a of the individual tabs are.

In the lead frame 38, the plurality of leads 37 and the first tab 34, second tab 35, and third tab 36 much thicker than the leads are integrally formed. They are formed of one contour strip material of copper alloy, for example. The plate thickness of the leads 37 and that of the tabs can be made different by metal rolling.

As illustrated in FIG. 13 and FIG. 14, V-grooves (groove portions) 34c, 35c, and 36c are formed at the respective peripheral areas of the main surfaces 34a, 35a, and 36a of the first tab 34, second tab 35, and third tab 36.

Second groove portions 38b deeper than the V-grooves 34c, 35c, and 36c are formed in suspending portions 38d that support the outer side portions of the tabs positioned at both ends, of the three tabs.

As illustrated in FIG. 14, a protruding portion 38f is formed on the respective side faces of the first tab 34, second tab 35, and third tab 36 and in the second groove portions 38b. The protruding portions 38f can be formed by crushing or the like.

As a method for varying the thickness of the tabs in the lead frame 38, the lead frame 38 may be formed of two frame materials, different in thickness, as illustrated as a modification in FIG. 15 and FIG. 16. That is, the following method may be adopted: the first tab 34, second tab 35, and third tab 36 are formed using a thick plate material; the lead frame 38 is formed using a thin plate material, and then caulking portions 38h are formed by caulking to couple together each tab and the lead frame 38.

After the lead frame 38 illustrated in FIG. 11 is prepared, die bonding is carried out.

Here, the first semiconductor chips 30 and the second semiconductor chips 31 are mounted over the respective tabs with solder 43 in-between. At this time, of the six semiconductor chips, either the three first semiconductor chips 30 including a pMISFET 32 or the three second semiconductor chips 31 including an nMISFET 33 are continuously die-bonded. Then, the lead frame 38 is turned upside down, and the other three semiconductor chips are die-bonded.

As mentioned above, the V-grooves 34c, 35c, and 36c are formed at the peripheral areas of the respective main surfaces 34a, 35a, and 36a of the tabs. Therefore, solder 43 that is melted and runs off during die bonding can be prevented from flowing out by causing the solder 43 to flow into the V-grooves 34c, 35c, and 36c.

After die bonding, wire bonding is carried out. The electrodes on the main surfaces 30a and 31a of the semiconductor chips and the corresponding leads 37 are electrically connected with each other through wires 39. At this time, the leads 37 are disposed at a higher level than the individual tabs as illustrated in FIG. 17. Thus, the wires 39 can be prevented from being brought into contact with an edge of the main surface of a chip.

As a result, the wires 39 can be prevented from being short-circuited to a first semiconductor chip 30 or a second semiconductor chip 31.

Thereafter, plastic molding is carried out. Here, using such sealing resin as epoxy resin, the semiconductor chips, the plurality of wires 39, and the like are plastic molded to form the sealing portion 44. At this time, plastic molding is carried out so that the back sides 34b, 35b, and 36b of the individual tabs are exposed at the underside of the sealing portion 44 as illustrated in FIG. 7.

As mentioned above, the protruding portions 38f are formed on the side faces of the first tab 34, second tab 35, and third tab 36 and in the second groove portions 38b. Therefore, bonding power can be enhanced between the sealing resin and each tab.

Thereafter, the dam bars 38e in the lead frame 38 are cut to insulate each lead 37 from the adjoining leads 37.

Thereafter, the outer leads 37e are coated with solder plating 45 to from outer plating. The leads 37 are cut off from the frame portion 38g of the lead frame 38, and the outer leads 37e are bent and formed (into gull wing shape). This completes the assembly of the HSOP 46.

Second Embodiment

Figure 19:
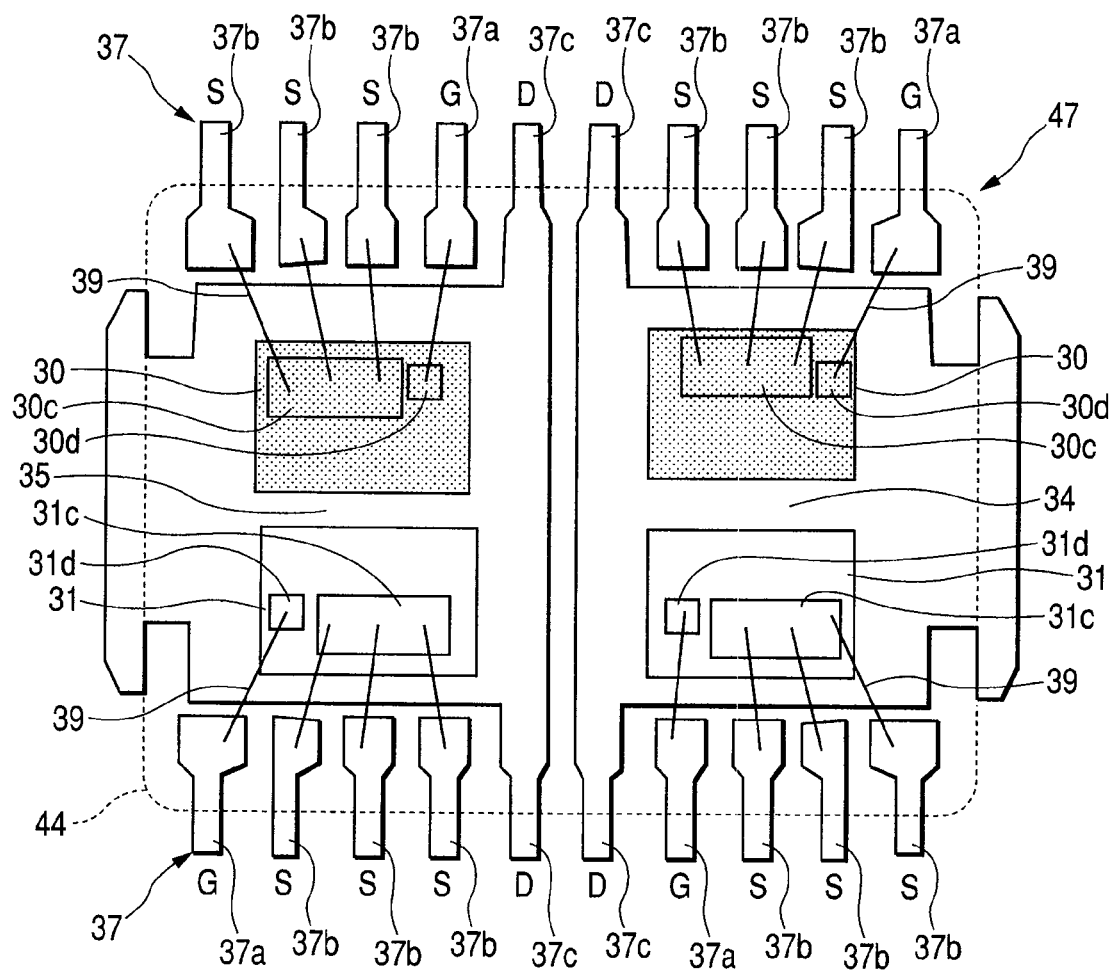
FIG. 19 is a plan view illustrating an example of the construction of a semiconductor device (with its tab divided into two and for driving a single-phase motor) in a second embodiment of the invention as viewed through its sealing portion.
Figure 20:
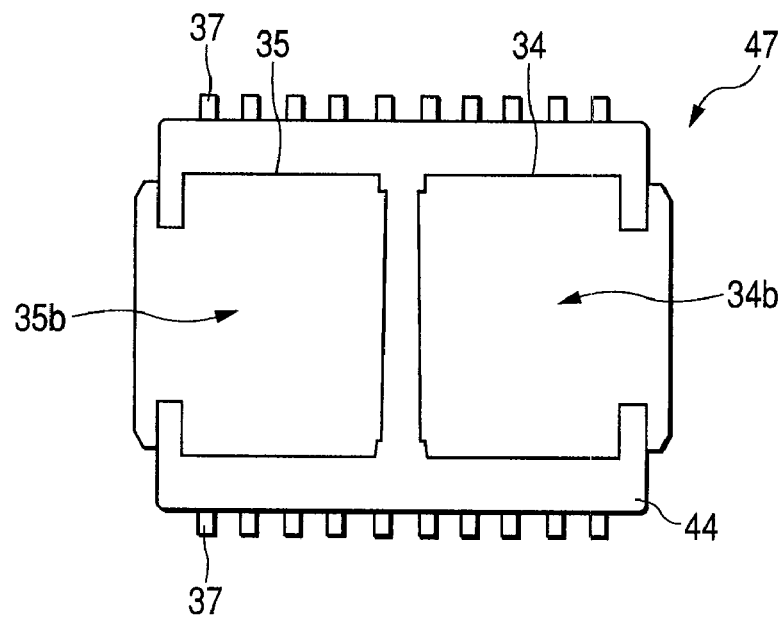
FIG. 20 is a rear view illustrating an example of the construction of the back side of the semiconductor device illustrated in FIG. 19, as applied to HSOP.
Figure 21:
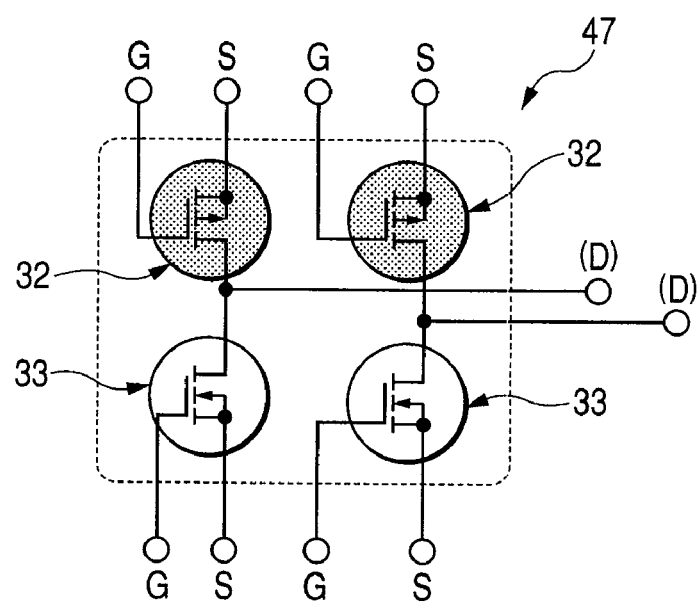
FIG. 21 is an equivalent circuit diagram illustrating an example of the circuitry for driving a single-phase motor in the semiconductor device illustrated in FIG. 19.

FIG. 19 is a plan view illustrating an example of the construction of a semiconductor device (with its tab divided into two and for driving a single-phase motor) in a second embodiment of the invention as viewed through its sealing portion; FIG. 20 is a rear view illustrating an example of the construction of the back side of the semiconductor device illustrated in FIG. 19, as applied to HSOP; and FIG. 21 is an equivalent circuit diagram illustrating an example of the circuitry for driving a single-phase motor in the semiconductor device illustrated in FIG. 19.

The semiconductor device in the second embodiment illustrated in FIG. 19 is HSOP 47 for driving a single-phase motor, and two pMISFETs 32 and two nMISFETs 33 are incorporated into the device. FIG. 21 is a drawing illustrating an example of an equivalent circuit for driving a single-phase motor. It has two pMISFETs 32 on the high side and two nMISFETs 33 on the low side, and drives a motor 40 in a single phase by the four MISFETs in total. (Refer to FIG. 2 for the motor.)

In terms of circuitry, as illustrated in FIG. 19, the HSOP has two sets of circuits for driving, each set composed of a pMISFET 32 and an nMISFET 33, and it drives the motor 40 in a single phase by these circuits. Therefore, the HSOP 47 in the second embodiment is also a semiconductor device with p and nMISFETs incorporated together.

The HSOP 47 has two divided tabs (first tab 34 and second tab 35), and a set of a pMISFET 32 and an nMISFFT 33 is mounted over each tab. More specific description will be given. A first semiconductor chip 30 including a pMISFET 32 and a second semiconductor chip 31 including an nMISFET 33 are mounted over the main surface 34a of the first tab 34; and a first semiconductor chip 30 including a pMISFET 32 and a second semiconductor chip 31 including an nMISFET 33 are mounted over the main surface 35a of the second tab 35.

At this time, the two first semiconductor chips 30 each including a pMISFET 32 are placed on the high side, and the two second semiconductor chips 31 each including an nMISFET 33 are placed on the low side.

The source pads 30c formed over the main surfaces 30a of the first semiconductor chips 30 are electrically connected with corresponding leads 37b for source through conductive wire 39; the gate pads 30d similarly formed are electrically connected with corresponding leads 37a for gate through conductive wires 39. The back sides of the first semiconductor chips 30 form drain electrodes, and these drain electrodes are electrically connected with the tabs with solder or the like in-between. The tabs and the leads 37c for drain are integrally joined with each other.

Similarly, the source pads 31c formed over the main surfaces 31a of the second semiconductor chips 31 are electrically connected with corresponding leads 37b for source through conductive wires 39; the gate pads 31d similarly formed are electrically connected with corresponding leads 37a for gate through conductive wires 39. The back sides of the second semiconductor chips 31 from drain electrodes, and these drain electrodes are electrically connected with tabs with solder or the like in-between. The tabs and the leads 37c for drain are integrally joined with each other.

Therefore, the first semiconductor chip 30 and the second semiconductor chip 31 over the first tab 34 share a drain electrode between them over the tab. The first semiconductor chip 30 and the second semiconductor chip 31 over the second tab 35 share a drain electrode between them over the tab. That is, the first tab 34 and the second tab 35 are respectively electrically connected with the drains of a pMISFET 32 and an nMISFET 33. The drains of the pMISFETs 32 and the nMISFETs 33 are electrically connected with each other through each of the first tab 34 and the second tab 35.

FIG. 19 illustrates the disposition (G, S, D) of the plurality of leads 37 composed of leads 37a for gate, leads 37b for source, and leads 37c for drain as an example. However, the disposition of the leads is not limited to that illustrated in FIG. 19.

The HSOP 47 has a sealing portion 44 that seals parts of the first tab 34, second tab 35, and plural leads 37, the first semiconductor chips 30, and the second semiconductor chips 31. As in the HSOP 46 in the first embodiment, also in the HSOP 47, the back sides 34b and 35b of the first tab 34 and the second tab 35 are exposed from the sealing portion 44 as illustrated in FIG. 20.

As in the HSOP 46 in the first embodiment, also in the HSOP 47, each of the first tab 34 and the second tab 35 is so formed that it is much thicker than the leads 37.

In the semiconductor device (HSOP 47) in the second embodiment, the following is implemented in the HSOP 47 for driving a single-phase motor: a first semiconductor chip 30 including a pMISFET 32 and a second semiconductor chip 31 including an nMISFET 33 are mounted over each of the first tab 34 and the second tab 35. The drains of the pMISFET 32 and nMISFET 33 over each tab are electrically connected with each other. Thus, the HSOP 47 can be reduced in size. More specific description will be given. Two of four semiconductor chips each including MISFET are placed over each of two divided tabs, and these chips are packaged in one in a compact manner. This makes it possible to reduce the size of the HSOP 47 for driving a single-phase motor, having a plurality of chips.

The respective back sides 34b and 35b of the first tab 34 and second tab 35 that also function as drain terminals are exposed at the underside of the sealing portion 44. Further, each tab is so formed that it is thicker than the leads 37. Thus, each tab can be provided with a heat sink function to enhance the heat radiating property of the HSOP 47.

As a result, the heat radiating property of the HSOP 47 for driving a single-phase motor, having a plurality of chips can be enhanced.

Other effects obtained by the HSOP 47 are the same as by the above-mentioned HSOP 46, and the repetitive description of them will be omitted.

Third Embodiment

Figure 22:
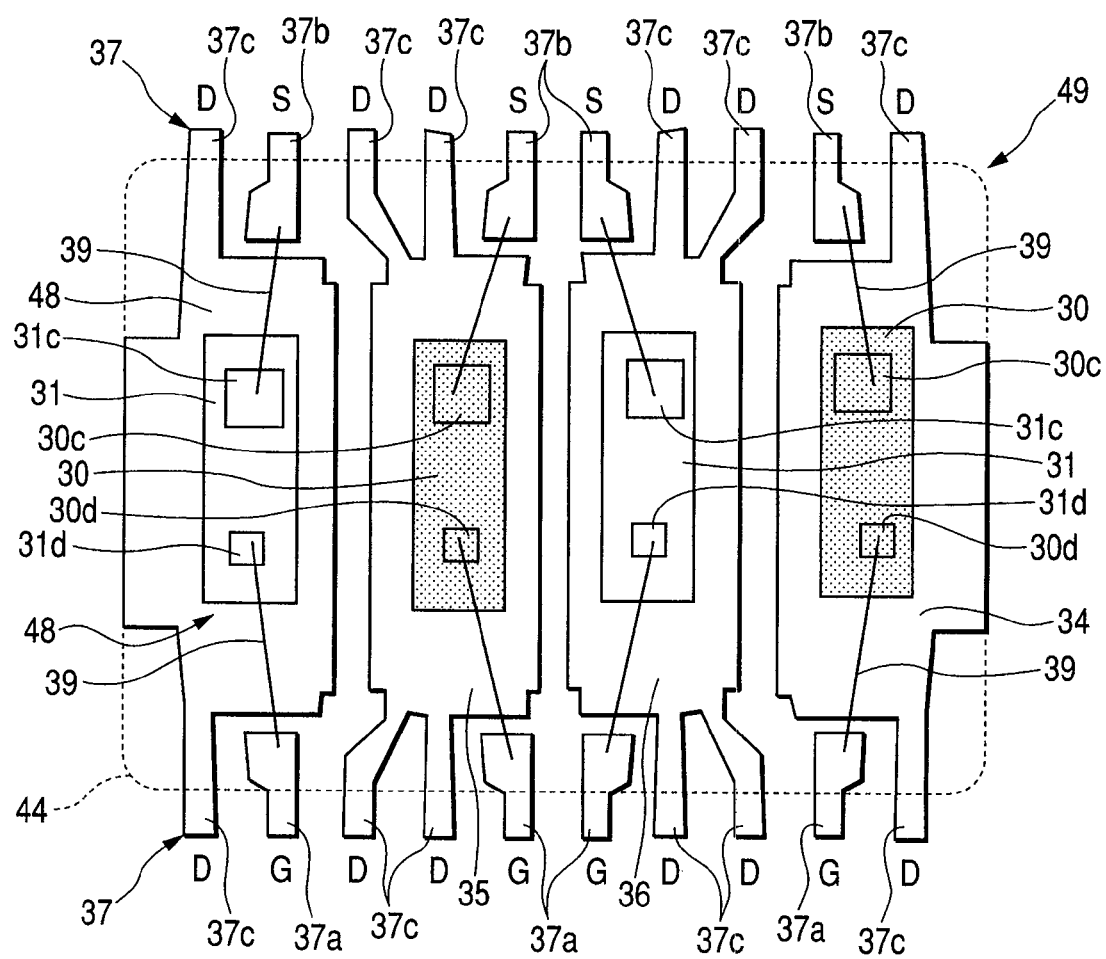
FIG. 22 is a plan view illustrating an example of the construction of a semiconductor device (with its tab divided into four and for driving a single-phase motor) in a third embodiment of the invention as viewed through its sealing portion.
Figure 23:
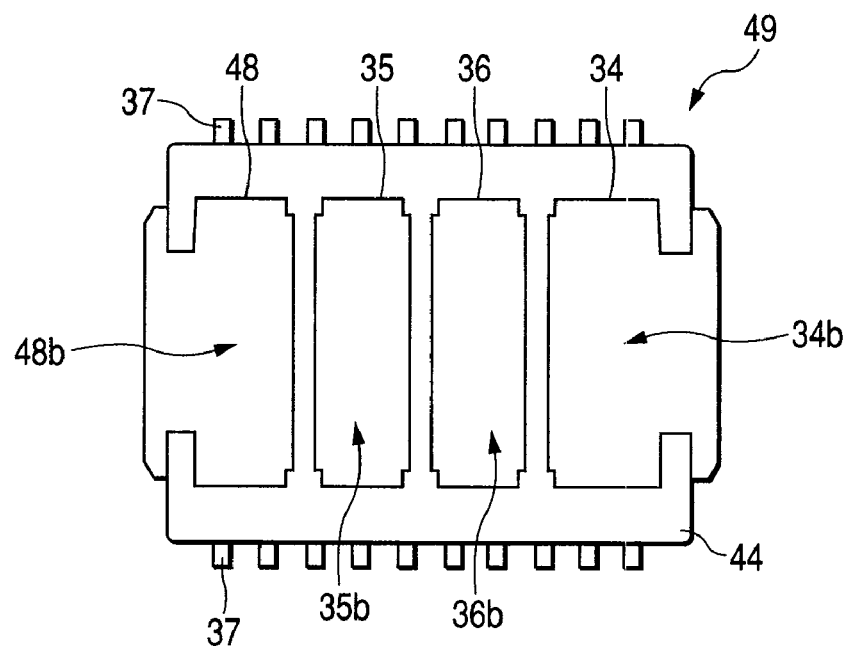
FIG. 23 is a rear view illustrating an example of the construction of the back side of the semiconductor device illustrated in FIG. 22, as applied to HSOP.
Figure 24:
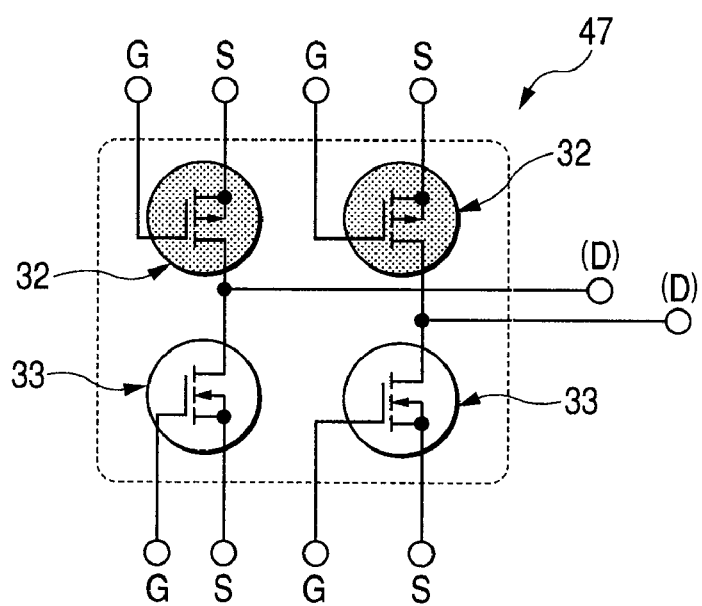
FIG. 24 is an equivalent circuit diagram illustrating an example of the circuitry for driving a single-phase motor in the semiconductor device illustrated in FIG. 22.

FIG. 22 is a plan view illustrating an example of the construction of a semiconductor device (with its tab divided into four and for driving a single-phase motor) in a third embodiment of the invention as viewed through its sealing portion; FIG. 23 is a rear view illustrating an example of the construction of the back side of the semiconductor device illustrated in FIG. 22, as applied to HSOP; and FIG. 24 is an equivalent circuit diagram illustrating an example of the circuitry for driving a single-phase motor in the semiconductor device illustrated in FIG. 22.

As in the second embodiment, the semiconductor device in the third embodiment illustrated in FIG. 22 is HSOP 49 for driving a single-phase motor, and two pMISFETs 32 and two nMISFETs 33 are incorporated into the device. FIG. 24 is a drawing illustrating an example of an equivalent circuit for driving a single-phase motor. It has two pMISFETs 32 on the high side and two nMISFETs 33 on the low side, and drives a motor 40 in a single phase by the four MISFETs in total. (Refer to FIG. 2 for the motor.)

In terms of circuitry, as illustrated in FIG. 22, the HSOP has four semiconductor chips individually mounted over different tabs. The four semiconductor chips are two first semiconductor chips 30 each including a pMISFET 32 and two second semiconductor chips 31 each including an nMISFET 33. The HSOP drives the motor 40 in a single phase by these circuits. The HSOP 49 in the third embodiment is also a semiconductor device with p and nMISFETs incorporated together.

The HSOP 49 has four divided tabs (first tab 34, second tab 35, third tab 36, and fourth tab 48), and either a pMISFET 32 or an nMISFET 33 is mounted over each tab. The HSOP 49 in the third embodiment is constructed as follows: first semiconductor chips 30 each including a pMISFET 32 are mounted over the main surfaces 34a and 35a of the first tab 34 and the second tab 35; and second semiconductor chips 31 each including an nMISFET 33 are mounted over the main surfaces 36a and 48a of the third tab 36 and the fourth tab 48.

At this time, the four tabs are arranged in the order of first tab 34, third tab 36, second tab 35, and fourth tab 48 from either end. Since the pMISFETs 32 and the nMISFETs 33 are alternately placed, circuit connection can be easily carried out with respect to the pMISFETs 32 and the nMISFETs 33.

The source pads 30c formed over the main surfaces 30a of the first semiconductor chips 30 are electrically connected with corresponding leads 37b for source through conductive wires 39; the gate pads 30d similarly formed are electrically connected with corresponding leads 37a for gate through conductive wires 39. The back sides of the first semiconductor chips 30 form drain electrodes, and these drain electrodes are electrically connected with the tabs with solder or the like in-between. The tabs and the leads 37c for drain are integrally joined with each other.

Similarly, the source pads 31c formed over the main surfaces 31a of the second semiconductor chips 31 are electrically connected with corresponding leads 37b for source through conductive wire 39; the gate pads 31d similarly formed are electrically connected with corresponding leads 37a for gate through conductive wire 39. The back sides of the second semiconductor chips 31 form drain electrodes, and these drain electrodes are electrically connected with the tabs with solder or the like in-between. The tabs and the leads 37c for drain are integrally joined with each other.

FIG. 22 illustrates the disposition (G, S, D) of the plurality of leads 37 composed of leads 37a for gate, leads 37b for source, and leads 37c for drain as an example. However, the disposition of the leads is not limited to that illustrated in FIG. 22.

The HSOP 49 has a sealing portion 44 that seals parts of the first tab 34, second tab 35, third tab 36, fourth tab 48, and plural leads 37, the first semiconductor chips 30, and the second semiconductor chips 31. As in the HSOP 46 in the first embodiment, also in the HSOP 49, the back sides 34b, 35b, 36b, and 48b of the first tab 34, second tab 35, third tab 36, and fourth tab 48 are exposed from the sealing portion 44 as illustrated in FIG. 23.

As in the HSOP 46 in the first embodiment, also in the HSOP 49, each of the first tab 34, second tab 35, third tab 36, and fourth tab 48 is so formed that it is much thicker than the leads 37.

In the semiconductor device (HSOP 49) in the third embodiment, the following is implemented in the HSOP 49 for driving a single-phase motor: either a first semiconductor chip 30 including a pMISFET 32 or a second semiconductor chip 31 including an nMISFET 33 is mounted over each of the first tab 34, second tab 35, third tab 36, and fourth tab 48. Thus, the HSOP 49 can be reduced in size. More specific description will be given. Each of four semiconductor chips each including MISFET is placed over each of four divided tabs, and these chips are packaged in one in a compact manner. This makes it possible to reduce the size of the HSOP 49 for driving a single-phase motor.

The respective back sides 34b, 35b, 36b, and 48b of the first tab 34, second tab 35, third tab 36, and fourth tab 48 that also function as drain terminals are exposed at the underside of the sealing portion 44. Further, each tab is so formed that it is thicker than the leads 37. Thus, each tab can be provided with a heat sink function to enhance the heat radiating property of the HSOP 49.

As a result, the heat radiating property of the HSOP 49 for driving a single-phase motor, having a plurality of chips can be enhanced.

Other effects obtained by the HSOP 49 are the same as by the above-mentioned HSOP 46, and the repetitive description of them will be omitted.

Up to this point, the invention made by the present inventors has been concretely described based on embodiments of the invention. However, the invention is not limited to the above-mentioned embodiments, and various modifications can be made without departing from the scope of the invention, needless to add.

An example will be taken. In the above description of the first, second, and third embodiments, the semiconductor device is HSOP with its outer leads 37e bent and formed into gull wing shape. The semiconductor device need not be HSOP, and it may be any other semiconductor device, such as SOJ (Small Outline J-leaded Package).

The invention is favorably applicable to an electronic device having a plurality of chips.

What is claimed is:

1. A semiconductor device for driving a single-phase motor, comprising:
    a first tab which has a main surface and a back surface on an opposite side of the main surface;
    a second tab which has a main surface and a back surface on an opposite side of the main surface;
    a first semiconductor chip including a pMISFET is mounted over the main surface of the first tab;
    a second semiconductor chip including a pMISFET is mounted over the main surface of the second tab;
    a third semiconductor chip including a nMISFET is mounted over the main surface of the first tab;
    a fourth semiconductor chip including a nMISFET is mounted over the main surface of the second tab;
    a plurality of first leads electrically connected with each of the first and second semiconductor chips;
    a plurality of second leads which are disposed in an opposed position to the plurality of first leads and electrically connected with each of the third and fourth semiconductor chips; and
    a sealing portion that seals a part of the first tab, a part of the second tab, parts of the plurality of first and second leads, and the semiconductor chips,
    wherein the first and second semiconductor chips are disposed nearer the plurality of first leads than the plurality of second leads;
    wherein the third and fourth semiconductor chips are disposed nearer the plurality of second leads than the plurality of first leads;
    wherein a drain of the pMISFET of the first semiconductor chip and a drain of the nMISFET of the third semiconductor chip are electrically connected with each other through the first tab; and
    wherein a drain of the pMISFET of the second semiconductor chip and a drain of the nMISFET of the fourth semiconductor chip are electrically connected with each other through the second tab.

2. The semiconductor device according to claim 1, wherein the respective back surfaces of the first and second tabs are exposed from the sealing portion.

3. The semiconductor device according to claim 1, wherein the thickness of each of the first and second tabs is larger than the thickness of the leads.

* * * * *